United States Patent [19]
Batchelder

[11] Patent Number: 5,884,691
[45] Date of Patent: Mar. 23, 1999

[54] FLUID TRANSMISSIVE MODERATED FLOW RESISTANCE HEAT TRANSFER UNIT

[76] Inventor: John Samual Batchelder, 2 Campbell Dr., Somers, N.Y. 10589

[21] Appl. No.: 922,291

[22] Filed: Sep. 3, 1997

[51] Int. Cl.⁶ .................................. F28F 7/00; H05K 7/20
[52] U.S. Cl. .......................... 165/80.3; 165/185; 361/697; 257/722
[58] Field of Search .................................. 165/80.3, 184, 165/185; 361/697, 704, 710; 174/16.3; 257/719, 722

[56] References Cited

U.S. PATENT DOCUMENTS

| | | | |
|---|---|---|---|
| 1,516,430 | 11/1924 | Hess | 165/184 X |
| 3,232,344 | 2/1966 | Andersson et al. | 165/185 X |
| 5,195,576 | 3/1993 | Hatada et al. | 165/80.3 |
| 5,507,092 | 4/1996 | Akachi | 29/890.03 |

FOREIGN PATENT DOCUMENTS 793344  1/1936  France ................................. 165/153

*Primary Examiner*—Allen Flanigan
*Attorney, Agent, or Firm*—Rodney T. Hodgson

[57] ABSTRACT

A heat transfer unit for transferring heat between an object and a flowing fluid, comprising a plurality of elongated loops of heat conducting material in the form of a spiral, each elongated loop having a first end and a second end, the first end of each loop connected in a closely spaced apart relationship to the first end of an adjacent loop, the second end of each loop connected in a closely spaced apart relationship to the second end of an adjacent loop.

10 Claims, 8 Drawing Sheets

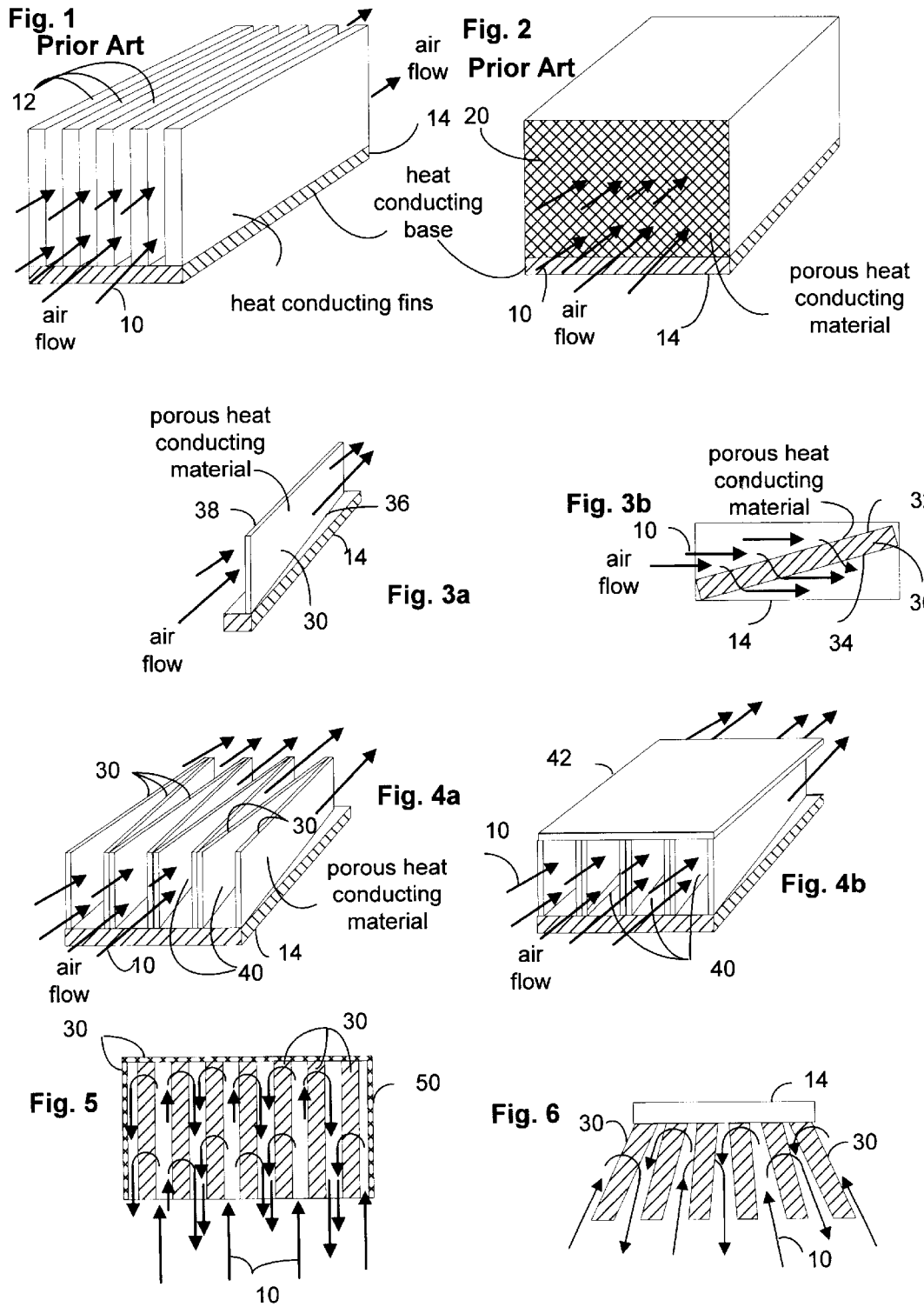

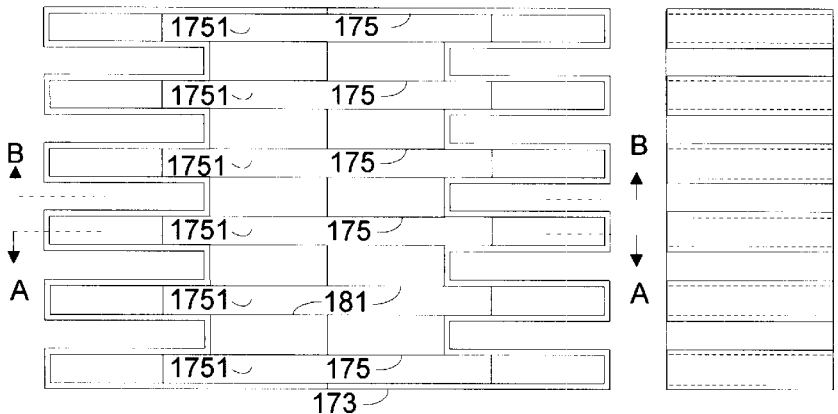
Fig. 19a
Fig. 19b
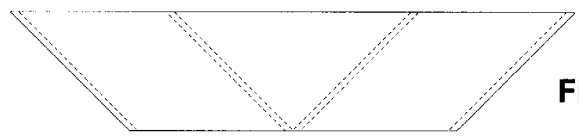
Fig. 19c
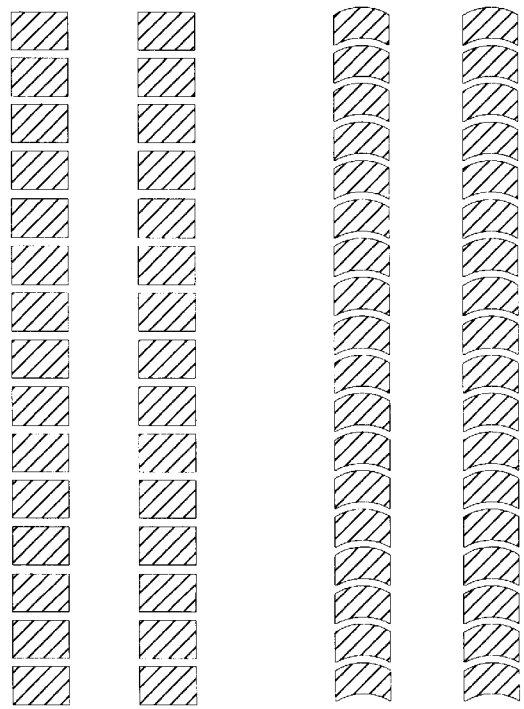
Fig. 26a
Fig. 26b
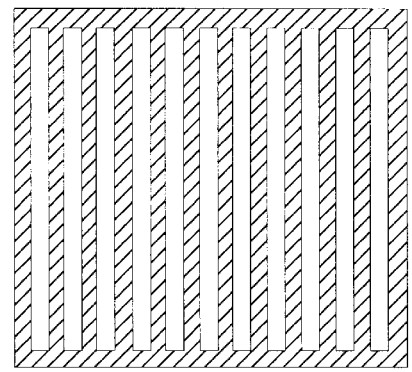
Fig. 20b

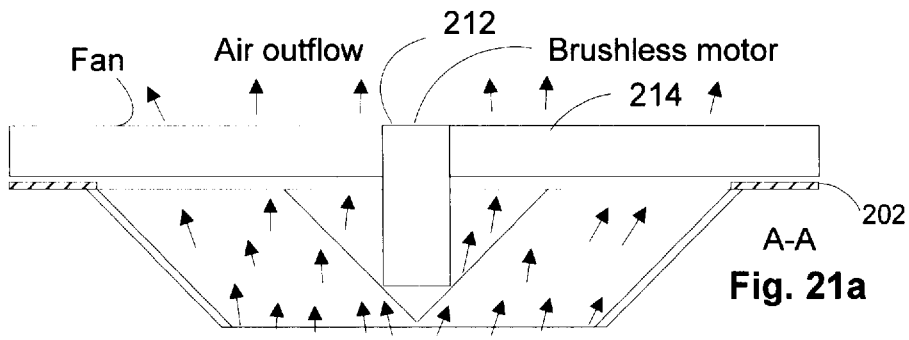
Fig. 21a
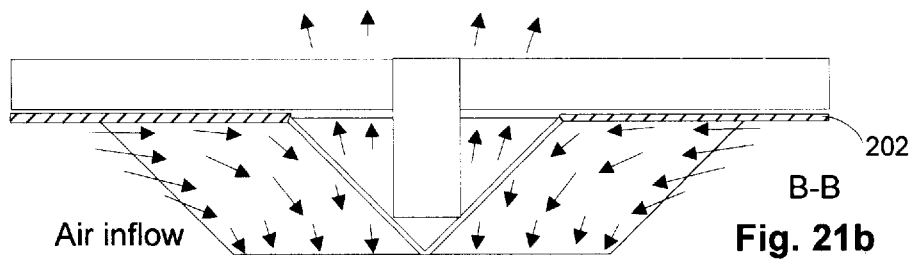
Fig. 21b
Fig. 20a
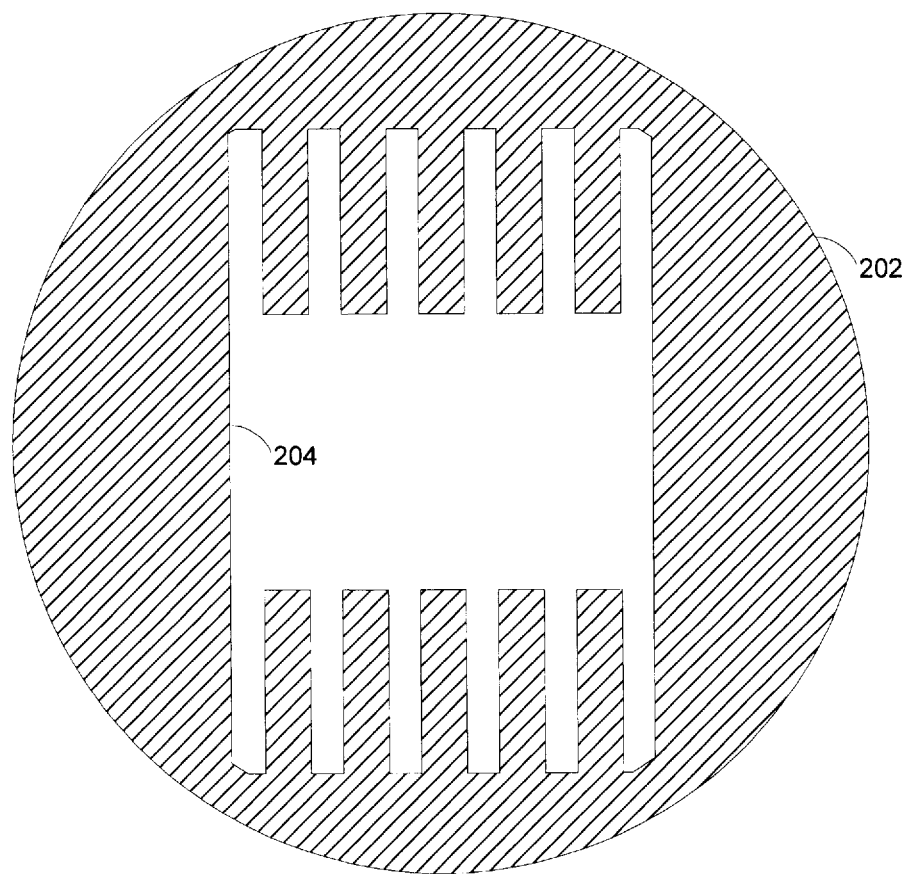

FLUID TRANSMISSIVE MODERATED FLOW RESISTANCE HEAT TRANSFER UNIT

FIELD OF THE INVENTION

The field of the invention is the field of apparatus and methods for transferring heat between an object and a flowing fluid.

BACKGROUND OF THE INVENTION

Applications of convective heat transfer devices range from chemical refineries to air conditioning to locomotion to computing to machining. In this disclosure we look to minimize the power required for forced fluid convection heat transfer devices to operate. This improvement is important for portable devices, for applications attempting to minimize power consumption, for minimizing noise generation, and for minimizing wear.

In particular we look to reduce the thermal resistance for heat sinks applied to electronic devices such as insulated gate bipolar transistors (IGBTs), silicon controlled rectifiers, microprocessors, injection laser diodes, and thermoelectric modules.

In U.S. Pat. No. 5,507,092 Akachi describes a spiral of flat fins stamped from a sheet and attached to a rigid base. Each fin is attached at one end only. In U.S. Pat. No. 5,358,032 Arai describes a folded wire mesh brazed to a rigid base. Wires in the mesh parallel to the base block fluid flow without significant contribution to heat transfer. In U.S. Pat. No. 3,416,218 Armenoff describes making an expanded metal cellular core. The bonding techniques are applicable to a fin array heat sink. In U.S. Pat. No. 5,158,136 Azar a pin field heat sink that generates recirculating flow. The pins are attached at one end, and air is sheared many times as it passes through the pin field. In U.S. Pat. No. 5,304,846 Azar describes heat sinks composed of dense fin arrays. The fins are formed as slots in a solid plate. In U.S. Pat. No. 5,150,748 Blackmon describes a heat radiator composed of a shag rug of conductive fibers. The spacings between the fibers are not uniform. In U.S. Pat. No. 5,299,080 Brady describes a heat sink pin array in the form of a shaving cream brush. The air flow across each pin is greatest at the greatest distance from the heated surface. In U.S. Pat. No. 4,449,164 Carlson describes a plenum that ducts air over a radial fin array. The flows in adjacent channels are parallel. In U.S. Pat. No. 4,843,693 Chisholm describes a folded wire mesh brazed to a rigid base. Wires in the mesh parallel to the base block fluid flow without significant contribution to heat transfer. In U.S. Pat. No. 5,121,613 Cox describes an A-frame Freon cooler. Heat is supplied to the fin arrays from embedded pipes. In U.S. Pat. No. 4,993,482 Dolbear uses wire coils compressed between parallel plates as compliant thermal shunt between the two plates. Heat is not being transferred to a fluid. In U.S. Pat. No. 5,590,712 Fisher describes a method of manufacturing a pin fin array. Each fin is attached at one end only. In U.S. Pat. No. 4,753,290 Gabuzda describes a radial fin array attached to a rigid base. The spacing between the fins is not uniform, and the fins are attached at one end only. In U.S. Pat. No. 231,485 Gold described wire coils trapped between radiator plates for heating air. Individual loops of the coils are circular, and they are not attached to their neighboring loops. In U.S. Pat. No. 4,768,581 Gotwald describes multiple dense fin arrays fed by multiple ducts. The fins are laminated together at one end only. In U.S. Pat. No. 5,388,635 Gruber describes fin arrays formed in a metal cooling sheet fed by multiple ducts. The fins are formed as slots partially through the metal sheet. In U.S. Pat. No. 5,058,665 Harada describes a stacked plate heat exchanger in which each plate has an array of circular holes. In U.S. Pat. No. 5,195,576 Hatada describes a heat sink composed of corrugated fine wires individually attached to a heated plate. The wires are attached only at the heated plate. In U.S. Pat. No. 4,777,560 Herrell stacks right and left handed stamped elements to make a fin array. The air flow across the fins is the greatest at the greatest distance from the heated surface. In U.S. Pat. No. 1,516,430 Hess attaches continuous wire loops to a pipe in a heat exchanger. Each loop is attached only at one point. In U.S. Pat. No. 4,879,891 Hinshaw describes a method of forming a dense fin array out of a solid. The fins are attached at their bases only. In U.S. Pat. No. 4,884,331 Hinshaw describes a method of forming a pin fin array out of a solid. The pin fins are attached at their bases only. In U.S. Pat. No. 3,327,779 Jacoby describes a pin grid heat sink formed by pressing staples through a flexible sheet. The resulting pins are attached at their bases only. In U.S. Pat. No. 5,353,867 Jaspers describes a pin fin array formed from stacked sheets in which the pattern of holes in the sheets forms the pins and the parallel supply and exhaust channels. The design is constrained to have substantially less than 50% of the heated surface area spanned by the combined pin cross sectional area. In U.S. Pat. 5,486,980 Jordan describes a pin fin array cooled by air initially impinging along the axis of each pin. The pins are attached at their bases only. In U.S. Pat. No. 3,372,741 Kaiser uses elongated wire loops to make a pin array that bridges radially between two concentric pipes. The gaps between the loops are not uniform. In U.S. Pat. No. 5,241,452 Kitajo describes a fin array in which the ends of the fins are tapered to enhance air flow near the heated surface. The fins are attached at their bases only. In U.S. Pat. No. 5,005,640 Lapinski describes a heat transfer manifold containing many parallel flow channels. The flow in adjacent channels is parallel. In U.S. Pat. No. 5,311,928 Marton describes louvered fin arrays formed from stamped metal. The design is constrained to have substantially less than 50% of the heated surface area spanned by the combined fin cross sectional area. In U.S. Pat. No. 4,898,234 McGovern describes a porous block heat exchanger with an interdigitated manifold. The flows in adjacent channels in the manifold are parallel. In U.S. Pat. Pat. No. 5,381,859 Minakami describes a pin fin heat sink assembled as a transformer core with spacers between slotted plates. The minimum number of slotted plates in a stack is three. In U.S. Pat. No. 4,821,389 Nelson teaches a method to make a pin fin array by radially slicing a spool of wire with a soluble coating. The resulting arrays of parallel wires are end bonded to two support plates. In U.S. Pat. No. 4,884,630 Nelson describes a liquid manifold for a heat sink containing multiple parallel channels. The flows in adjacent channels are parallel. In U.S. Pat. No. 5,180,001 Okada describes layering metal mesh to form a heat sink. The fluid flow passage cross sections are non-uniform. In U.S. Pat. No. 3,706,127 Oktay describes a pin fin array in the shape of a shaving cream brush formed by electroless plated iron filings. The air flow across each pin is greatest at the greatest distance from the heated surface. In U.S. Pat. No. 1,559,180 Prat described wire coils trapped between radiator plates for heating air. Individual loops of the coils are circular, and they are not attached to their neighboring loops. In U.S. Pat. No. 2,544,183 Rogers describes a heat exchanger utilizing wire coils of elongated loops in a circumferential arrangement between two plates. The spacing between the loops is not constant. In U.S. Pat. No. 5,561,338 Roberts describes an arc lamp heat sink in which a copper strip is corrugated to form radial fins between concentric cylinders. The spacing between the fins is not uniform. In U.S. Pat. No. 4,421,161 Romania describes a wire helix formed to transfer heat from an electronic package to air. The resulting wire loops are elongated parallel to the surface of the package, and the loops are not attached at their ends distant from the package. In U.S. Pat. No. 4,884,631 Rippel describes a fin array composed of bonded and expanded sheet metal. Metal sheets nearly parallel to the base block fluid flow without significant contribution to heat transfer. In U.S. Pat. No. 1,716,743 Still describes elongated wire coil fins arranged in a spiral about a hot pipe. The gaps between the wires are non-uniform. In U.S. Pat. No. 2,093,256 Still describes a heat exchanger in which flattened wire helixes are wound in elongated loops around support wires or tubes. The loops are specified as having an open pitch. In U.S. Pat. No. 4,450,472 Tuckerman describes a heat transfer technique in which slots cut in the back of a semiconductor chip to form fins. The fins are attached at their bases only. In U.S. Pat. No. 5,212,625 van Andel describes a pin fin field in which each pin is bent to collectively form interdigitated flow channels. The flow resistance through the pins is non-uniform, and the flows in adjacent channels are parallel. In U.S. Pat. No. 5,205,353 Willemsen describes a heat exchanger utilizing porous metal and interdigitated flow channels. The flows in adjacent channels are parallel. In U.S. Pat. No. 4,009,752 Wilson described a fin array formed by clamping individual fins in upper and lower capture plates. The resulting soldered assembly is rigid and non-compliant. The above identified U.S. patents are hereby incorporated by reference.

OBJECTS OF THE INVENTION

It is an object of the invention to provide a heat exchange unit for exchanging heat between an object in thermal contact with the unit and a flowing fluid flowing through the unit, wherein the pressure drop in the flowing fluid approaches the minimum pressure drop necessary to transfer the heat.

It is an object of the invention to provide a system of a plurality of heat exchange units for exchanging heat between an object in contact with the units and a flowing fluid flowing through the units, wherein the units help channel and control the flowing fluid to minimize the pressure drop in the flowing fluid and where all of the volume of the units may be effectively used to transfer heat between the object and the flowing fluid.

It is an object of the invention to provide a housing operating in cooperation with a system of a plurality of heat exchange units to provide control of fluid flow to and from the units and to provide an inexpensive and efficient use of the flowing fluid for exchanging heat between the body and the flowing fluid.

SUMMARY OF THE INVENTION

An innovative fluid transmissive, heat conducting unit comprising a helix of elongated wire loops where the spaces between the wires is carefully controlled is placed in thermal contact with a heat source or sink. An innovative apparatus uses a plurality of such fluid transmissive units whereby two surfaces of each unit comprise walls of a channel which channels a flowing fluid so that the flowing fluid has a substantial velocity component tangential to the surface of the unit. An embodiment of the invention channels the flowing fluid so that the cross sectional area of the inlet channel decreases in the direction of the flowing fluid, and the cross sectional area of the outlet channel increases in the direction of the flowing fluid. Innovative heat exchange units are disclosed which minimize fluid flow for a given heat transfer. An innovative housing is disclosed which effectively "focuses" the flowing fluid, whereby the typical heavy and thick "heat spreader" used in prior art devices is avoided.

BRIEF DESCRIPTION OF THE DRAWINGS

FIG. 1 is a sketch of a prior art finned heat exchanger.

FIG. 2 is a sketch of a prior art porous heat exchanger.

FIG. 3a is a sketch of a fluid transmissive heat exchange unit of the invention in perspective view.

FIG. 3b is a sketch of a fluid transmissive heat exchange unit of the invention in plan view.

FIG. 4a shows a preferred embodiment of a plurality of fluid transmissive, heat conducting units arranged so that the air flow is channeled into a plurality of channels.

FIG. 4b shows the channels of FIG. 4a with a cap which forces the air to flow in the channels.

FIG. 5 shows a sketch of an embodiment of the invention.

FIG. 6 shows a sketch of an embodiment of the invention.

FIG. 19a shows a plan view of the manifold of FIG. 17.

FIG. 19b shows an end elevation view of the manifold of FIG. 17.

FIG. 19c shows a side elevation view of the manifold of FIG. 17.

FIG. 20a shows a plate for sealing the top of the manifold of FIG. 17 to a fan for exhausting the air from the units 30.

FIG. 20b shows an optional plate for sealing the bottom of the manifold of FIG. 17 to the units of FIGS. 5, 6, 7, or 12.

FIG. 21a shows a view of the manifold of FIG. 17 along the line A–A' of FIG. 19a.

FIG. 21b shows a view of the manifold of FIG. 17 along the line B–B' of FIG. 19a.

FIG. 26a is a view of the cross section of the wires of loops of FIG. 10 showing a rectangular cross section wire.

FIG. 26b is a view of the cross section of the wires of loops of FIG. 10 showing non rectangular cross section wire.

DETAILED DESCRIPTION OF THE INVENTION

Figure 7:
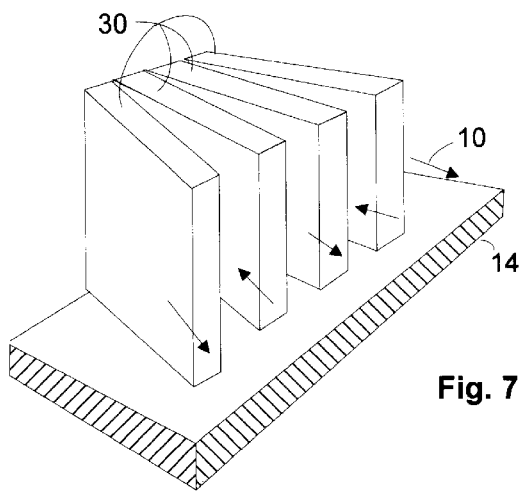
FIG. 7 shows a perspective sketch of an embodiment of the invention.

This invention is concerned with heat transfer from a solid object through a solid surface of that object to a fluid heat transfer medium, in which the solid surface is in thermal contact with a heat transfer device, and the heat transfer fluid is forced to flow through the heat transfer device, resulting in heat transfer by forced convection. A variety of terms are used to name such a heat transfer device—examples include radiator, heat or cold sink, heating or cooling fins, heat exchanger, thermal conduction module, cooling hat, and pin array. In this specification we collectively refer to this type of device as a convector.

Colburn convector

To measure the relative performance of this and other convectors, we choose as a figure of merit the power consumed in forcing the convective flow of the thermal transfer fluid for a fixed aerial thermal resistance. The best convectors minimize such a figure of merit. To justify this merit function, we first observe that many cooling applications have a maximal aerial thermal resistance requirement set by external parameters; for example power and logic semiconductor devices have a maximum junction temperature, a maximum environmental temperature, a package thermal resistance, and a maximum ohmic power dissipation per unit area—these combine to give a minimum acceptable aerial thermal resistance (measured in, for example, degrees Centigrade square inches per watt). Using a convector with an aerial thermal resistance higher than this amount causes device failure, and using a convector with an aerial thermal resistance significantly lower than this amount improves the device life somewhat but otherwise is not an important improvement over a convector with the minimum acceptable aerial thermal resistance. Convectors attached to thermoelectric devices have a similar requirement; the thermoelectric device ceases to function as a heat pump if the attached convector has too high an aerial thermal resistance. We observe, however, that any convector can generally have its effective aerial thermal resistance reduced by increasing the flow rate of the thermal fluid passing over or through it. The absolute aerial thermal resistance is not a good measure of the performance of a convector independent of the thermal fluid flow rate. Power is consumed in pumping thermal fluid, noise is often introduced, sometimes static discharge is created by fluid flow, and pumping mechanisms wear out. Of the above problems, the noise introduced by the fan is often the determining factor in consumer acceptance of such a device, and the noise is linked in large part to the volume of air flow per second. Therefore we look to minimize the power dissipated in forcing the convective flow for a given aerial thermal resistance.

Appendix I details a calculation of the thermal resistance and convective pump power required for a convector formed from a parallel array of fins. The calculation is based on the Chilton-Colburn analogy, which establishes a connection between the shear rate of viscous flow and the heat transfer rate in convection. In essence, Chilton-Colburn tells us that there is a minimum energy that must go into shearing the fluid for a given heat transfer. Additional energy can be expended in pumping the heat transfer fluid; this energy can be spent in shearing flow where there is no temperature gradient, or in eddy currents and turbulence. From the calculation in the Appendix I, we have that the power required to pump the heat transfer fluid is $$W_{fan} = \frac{2^{14} L^3 \mu_{fluid}^3 H S}{3 g^5 \rho_{fluid}^2 \eta_{fan}(w+g) Pr^{4/3}} \quad \text{Eq.1}$$

L is the length of each fin. H is the height of each fin. S is the width of the stack of fins. g is the gap between a pair of fins. w is the thickness of each fin. $\rho_{fluid}$ is the density of the heat transfer fluid. $\mu_{fluid}$ is the viscosity of the heat transfer fluid. $\eta_{fan}$ is the electromechanical efficiency of the pumping apparatus. Pr is the Prandtl number for the heat transfer fluid. If each fin is slit $N_{splay}-1$ times and is splayed apart, additional entrances and exits for the air are created along the fin. This action reduces the power required to pump the heat transfer fluid given in Eq. 1 by a factor of $N^2_{splay}$. For a given geometry there is an optimal number of times the fin can be profitably sub-divided.

$$N_{splay} = \sqrt[4]{\frac{HL(w+g) \phi_{max}^3}{2^5 g^3}} \quad \text{Eq.2}$$

$\phi_{max}$ is the angle formed between the first and last splayed sub-divisions of the fin. Applying this splaying technique to the original fin array creates a Colburn convector. The power consumed by the pump device for the thermal transport fluid in this case is $$W_{fan|Colburn} = \frac{2^{16} \mu_{fluid}^3 S}{3 \eta_{fan} \rho_{fluid}^2 Pr^{4/3}} \sqrt{\frac{2 L^5 H}{g^7 (w+g)^3 \phi_{max}^3}} \quad \text{Eq.3}$$

The added complexity of the Colburn configuration is merited by the smaller gaps between the fins that can be tolerated for the same pumping power. While the power consumed by the standard fin array depends on the gap to the inverse fifth power, the power consumed by a Colburn convector depends on the gap to the inverse 3.5 power. This allows other characteristics of the convector such as its aerial or volumetric thermal resistance to be substantially improved without requiring additional pumping power.

In subsequent descriptions of the invention, we will refer to the direction of heat flow as being from the heat transfer surface through the convector into the heat transfer fluid. This reference is for convenience; heat can also flow from the heat transfer fluid through the convector into the heat transfer surface.

In subsequent descriptions of the invention, we will refer to the heated surface as being planar. While this is the most important specific case, other geometries are also contemplated, such as the inside or outside of cylinders, spheres, or combinations of convex and concaved surfaces.

In subsequent descriptions of the invention, we will refer to the heated surface as being in thermal contact with the convector. This can be intimate contact (such as welding, ultrasonic bonding, or molecular bonding), clamped contact of two mating surfaces through an intermediary material (such as a thin gas or oil layer, grease, or thermally conductive particle suspension), or adhesive bonding (for example with neat or filled epoxies, thermoplastics, or elastomers).

In subsequent descriptions of the invention, we will refer to air as the heat transfer fluid for the sake of convenience. The heat transfer fluid can be gasses (such as nitrogen, helium, Freons, or steam), liquids (such as water, glycol, Freons, hydrocarbons, and molten metals), or fluids of intermediate composition whose viscous character dominates their elastic character (such as thermoplastics and liquid crystals).

A prior art finned heat exchanger is shown in FIG. 1. The air flow 10 is forced between fins 12 which conduct heat perpendicular to the air flow direction from a heat conducting base 14.

A cap (not shown) may optionally be placed over the fins to ensure that air flows only between the fins.

An alternative prior air heat exchanger is shown in FIG. 2. Air flow 10 is forced through a porous heat conducting material 20 which is in thermal contact with a heat conducting base 14.

The heat exchanging unit of the invention is shown in FIG. 3a in perspective, and in FIG. 3b in plan view. The air flow 10 is constrained to flow so that the air flow 10 velocity has a large component parallel to the surface of a fluid transmissive, heat conducting unit 30, which is thermally contacted to a heat conducting base 14 at a surface 36 of unit 30. The heat conducting base 14 may be the object which is to be cooled, or the unit 30 may be joined to a base 14 which is in turn in thermal contact to the object to be cooled. The unit 30 has a surface 32 which forms one wall of a channel which channels the air flow 10. (The remaining walls of a channel are not shown.) The air enters the unit 30 through the surface 32 and exits the unit 30 through the surface 34.

FIG. 4a shows a preferred embodiment where a number of fluid transmissive, heat conducting units 30 (or a single serpentine heat conducting unit) are arranged so that the air flow 10 is channeled into a plurality of channels 40, each channel having a decreasing cross section perpendicular to the direction of air flow. The side walls of the channels 40 are formed from the surfaces 32 of the units 30. FIG. 4b shows the channels with a cap 42 which forces the air to flow into the inlet channels 40 and through the fluid transmissive or porous units 30. The pressure drop along a channel 40 formed by the base 14, by the surfaces 32 of two neighboring units 30, and by the cap 42 is preferably small compared to the pressure drop of the fluid as it passes from surface 32 to surface 34 of an unit 30. It is important that the resistance to the fluid flow through the material of unit 30 is moderated so that the resistance is approximately inversely proportional to the heat which is to be transferred in that part of the unit 30. If the temperature varies little over the unit 30, the heat to be transferred per unit volume of the material of unit 30 varies little, and the resistance to the fluid flow should also vary little over the unit 30 in order to maximize efficiency of the device. If however the temperature of unit 30 varies substantially from the base 14 to the cap 42, less heat needs to be transferred near the cap, and the resistance to the fluid flow near the cap 42 should be higher than the resistance near the base 14. Prior art heat exchangers such as FIG. 1 and FIG. 2 typically have the same flow resistance over the entire entrance area of flowing gas, and consequently too much air flows at a point where there is little heat to be extracted from the heat exchanger. Such an excess air flow is inefficient.

FIGS. 3a–b and 4a–b show embodiments of the invention where the air flow has a substantial velocity component tangential to the surface of the heat transfer units 30. FIG. 5 shows a plan view of a figure of an additional embodiment of such a device where the air enters the device in one direction, and leaves the device in substantially the opposite direction as a plurality of interdigitated, counterpropagating streams. A housing 50 is shown which controls the air flow 10 in the units 30. The innovative housing necessary to channel the interdigitated, counterpropagating streams entering and exiting the device will be discussed later. The heat may enter the units 30 and travel perpendicular to the average direction of the air flow 10, or the heat may enter from the blind end of the device and travel parallel to the average direction of the air flow in the exit channels and the entrance channels, respectively.

The converging inlet channels 40 and outlet channels of FIG. 4a may be used to advantage by having the units 30 of FIG. 5 arranged with an angle between each unit 30 and its adjacent unit as shown in FIG. 6. The direction of the fluid flow 10 is shown in FIG. 6 directed approximately perpendicular to the surface of the base 14, and the direction of heat flow is approximately anti-parallel and parallel to the direction of the velocity of the flowing air flowing in towards the units 30 and away from the units 30 respectively. Note that the cross sectional area through which the fluid flow 10 enters the heat exchanger may be effectively increased in FIG. 6 over FIG. 5 by such splaying of the units 30.

The base 14 could be thermally contacted to different surfaces of units 30 as depicted in the perspective sketch of an alternative embodiment of the invention shown in FIG. 7. In FIG. 7, the heat flows from the base 14 into units 30 in a direction approximately perpendicular to the fluid flow direction.

Figure 8:
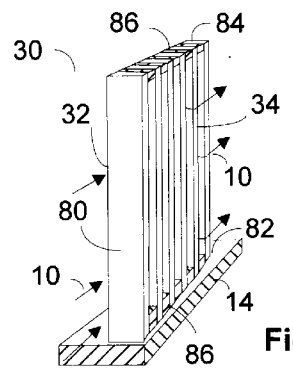
FIG. 8 shows a sketch of a heat transfer unit of the invention.

A preferred heat conductive, fluid transmissive unit is sketched in FIG. 8. The unit is composed of a number of parallel fins 80. One end of each fin terminates in a common plane 82 which may contact the base 14, one end of each fin optionally terminates in a common plane 84. One edge of each fin terminates on an air inlet plane 32 which again forms a wall of a channel for controlling the air flow, and another edge terminates on an air outlet plane 34. It is vital that the space between each parallel fin 80 is controlled so that the flow resistance is moderated according to the heat to be transferred. For this reason, each fin 80 is joined to the adjacent fin at two places so that the distance between each fin, and hence the flow resistance, does not change after manufacture. In the sketch shown in FIG. 8, the fins are joined at each end by attaching each fin to a strip of joining material, or by using a solidified joining material 86 such as a rigid epoxy or a rubbery silicone material which adheres to each fin and gives stability to the unit.

Figure 9:
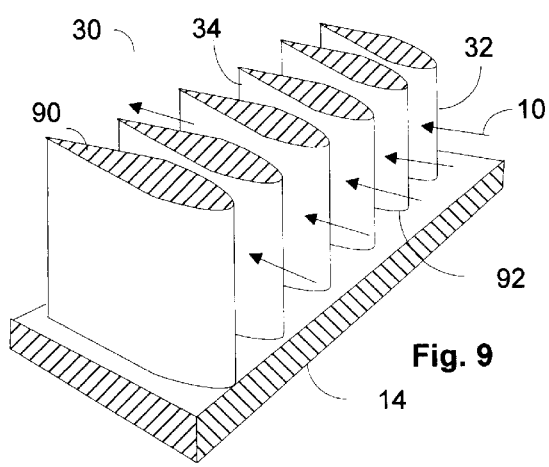
FIG. 9 shows a sketch of a pin array unit of the invention using airfoil elements.

A pin array implementation of a unit of the invention is shown in FIG. 9. The unit is composed of a number of parallel cylinders or airfoils 90. One end of each airfoil terminates in a common plane 92 that contacts the base 14. One edge of each airfoil terminates on an air inlet plane 32, and the trailing edge of each airfoil terminates on an air outlet plane 34. The airfoil shape is useful to avoid eddy currents trailing the airfoils which require input energy to the airflow and which do nothing to transfer heat from the airfoil to the flowing air.

Figure 10:
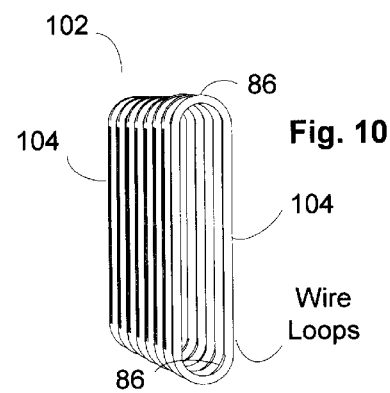
FIG. 10 shows a perspective sketch of the most preferred transmissive heat exchanger unit of the invention.

The most preferred implementation of the fluid transmissive, heat conducting unit of the invention is shown in FIG. 10. The free standing unit is composed of a double row of closely spaced apart wires. FIG. 10 shows the wires as a row 102 of elongated loops 104 of wire. Each loop is held in a closely spaced apart relationship with its neighboring loop by methods which will be discussed later. Each loop may be a single loop, or the loops may be joined as a continuous spiral of one piece of wire. Each loop is joined to each adjacent loop by a joining material 86 in order to give stability to the unit and to make sure that the distance between each wire does not change from that needed to ensure the moderated flow resistance necessary for efficient heat transfer. The free standing unit shown in FIG. 10 may be handled as a unit with little danger of perturbing the wire positions from the as manufactured positions.

Figure 11:
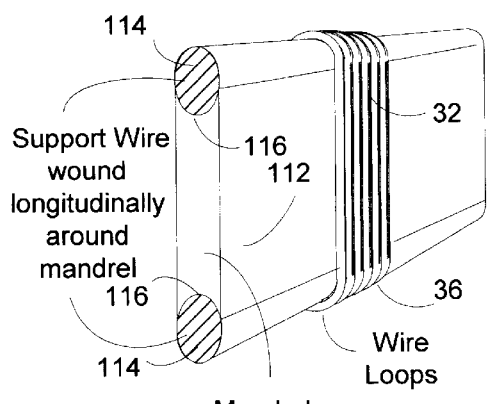
FIG. 11 shows a preferred method of forming the unit shown in FIG. 10.

A preferred method of forming the unit shown in FIG. 10 is shown in FIG. 11. A single strand of wire is wound about the edges of a flat mandrel 112 which is flanked by two support wires 114. Straightened music wire has been found to be adequate for the support wire 114. The support wire 114 can be a single loop wound lengthwise about the mandrel and securely fastened in a groove 116 formed in each thin edge of the mandrel. In a preferred method of producing the unit, the loops 104 are crimped to the support wires to freeze the positions of the windings and to release the mandrel so that the unit 30 can be removed from the mandrel. One edge of the unit 30 terminates in a common plane 36 that contacts the heated surface 14. Termination of the windings at the common plane 36 can be through point contact, by crimping or grinding a flat onto the unit 30. Termination of the windings at the common plane 36 can be done by potting the windings near the common plane 36 with epoxy or solder and forming the potting material into the common plane. One edge of each turn terminates on an air inlet plane 32, and one edge terminates on an air outlet plane 34. Windings can be performed with screw machine tools to maintain tolerances on small gaps between the wires.

The air flow gaps between elements of a unit need to be held to reasonably close tolerance. For a fixed pressure drop, the average air flow velocity is inversely proportional to the square of the gap spacing, so that a small perturbation in the size of the gaps leads to smaller gaps (that are insufficiently cooled) and larger gaps (that waste air). The elements should be fixed with respect to its neighbors to insure a gap which does not change in handling the free standing unit 30 during the manufacturing process and during assembly of the unit into a heat transfer system comprising a plurality of units 30 and associated manifolds and air blowing means (shown later). Prior art units such as those shown in FIG. 10 were manufactured and then the free standing unit was soldered to a heat transfer base. However, the elements of the prior art units were not joined together prior to the transfer from the mandrel, so that the air flow gaps were not controlled and in fact were varying over the faces 32 and 34 of the units so that the flow resistance did not meet the moderated flow criteria discussed above. The air flow gaps can be held to close tolerances by gluing, crimping, potting, soldering, welding, clamping, or any other method as practiced in the art. Crimping is especially valuable, since the wire is deformed and spreads to meet the adjacent wire in the region of the support wire. Gluing each end of each loop to the end of the adjacent loop with a flexible rubber adhesive is the most preferred embodiment, since each loop may move slightly with respect to each adjacent loop to ensure thermal contact with a rough or slightly non-planar base. A sketch of such a unit will be shown later.

Units are composed of materials with high thermal conductivities, such as copper, aluminum, silver, metal loaded polymers, and ceramics.

A preferred embodiment of the invention is to use a wire of rectangular cross section in the winding process as shown in FIG. 11. The crimping procedure is more controllable than with a wire of round cross section. In a preferred implementation, the wire can be drawn during the winding process so that the wire has a flat portion adjacent to the thin edge of the mandrel 112 at the end of each elongated loop, and can be formed as an airfoil shape as shown in FIG. 9 as it lays against the flat side of the mandrel. Of course, the wire drawing apparatus must change on each half revolution of the mandrel so that the "downstream" end of the wire lies against the mandrel on one side of the mandrel, and the "upstream" side of the wire lies against the mandrel on the opposite side of the mandrel.

Figure 12:
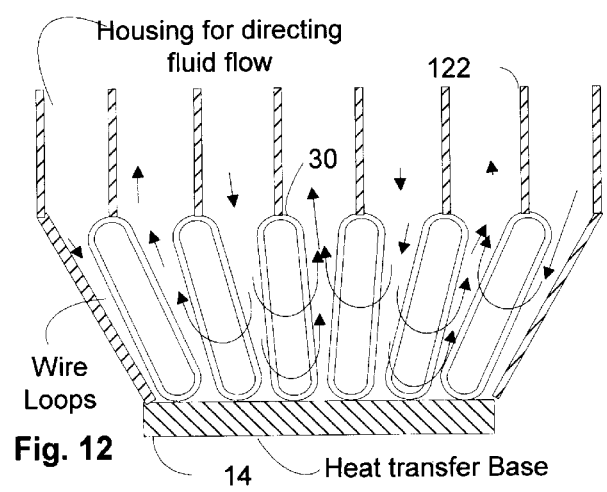
FIG. 12 shows a sketch of the most preferred embodiment of the invention.

FIG. 12 shows a sketch of the most preferred embodiment of the invention, where wire loop units 30 are contacted to a base 14 in the splayed arrangement shown. The cooling air enters and exits the converging and diverging channels between the units 30 as a plurality of interdigitated counterpropagating streams which have velocity approximately normally to the surface of the base 14. A manifold or housing 122 is shown delivering and receiving alternating interdigitated counterpropagating streams to the units. The converging and diverging entrance and exit channels ensure that little pressure drop occurs in the in-flowing and out-flowing air channels. The angles between the units shown in the drawing are 10 degrees, which is a near optimal angle for the dimensions shown. The preferred angles between units are from 3 degrees to 25 degrees, with the more preferred angles between 6 and 15 degrees. In the sketch shown in FIG. 12, the pressure drop in the inlet and outlet channels is less than 25% of the pressure drop from one side 32 of a unit 30 to the other side 34. The loops are formed from 0.025 inch copper wire, with 0.005 inch gap spacing between adjacent wires, and 0.050 inch spacing between surfaces 32 and 34. The loops are 0.8 inches high.

The height of the units (parallel to the direction of thermal conduction), the thermal conductivity of the unit, and the amount of air contained within the unit should be optimized. As explained in Appendix I, the thermal conductivity can be assumed adequate if the height of a thermal conduction element in a unit is less than or equal to 1/m, where $$m = \sqrt{\frac{8k_{fluid}Pr^{1/3}}{k_{element}wg}} \qquad \text{Eq. 4}$$

$k_{element}$ is the thermal conductivity of the material forming the element. w is the thickness of the element perpendicular to the direction of fluid motion. g is the gap or spacing between the elements through which the fluid moves. The unit should contain between 5% and 70% by volume thermally conductive material, with the most preferable range between 25% and 60%.

A unit can be made from a porous material, such as a sintered bronze or copper or aluminum mesh. More preferred embodiments described above use slots between elements in the unit as air conduction channels. The extra connective solid material which is not perpendicular to the base 14 within a porous unit restricts air flow and does not substantially improve conduction normal to the heated surface.

The shape and size of the air flow paths and hence the flow resistance through the unit should be determined by the Colburn principle that the volume rate of flow viscously sheared air should be proportional to the heat transferred between the elements of the heat exchange unit and the fluid, and there should be as little air flow as possible which is not sheared and does not participate in the heat exchange process. We will refer to this optimal condition as moderated flow resistance. For example, if the temperature of the unit is approximately uniform, the volume of the air flowing through unit 30 per unit area of the surface 32 should be approximately uniform. If the air flow distance between the air entrance plane 32 and exit plane 34 of a finned heat exchange unit is not constant, the resistance to the air flow would not in general be constant, and some parts of the unit would transfer less heat to the flowing air than other parts. Energy put into the system to move the air would thus be wasted. Such a situation arises in U.S. Pat. No. 5,504,651, which describes a fin array with triangular fins. The fins, which are the elements of the heat exchange unit have a uniform cross section, are cut into triangular shapes so that the cut ends of the fins determine flow channels for the cooling fluid. The fin array forms a unit as defined in the present specification, where the flow in the channels is substantially parallel to the surface 32 of the unit. However, the flow resistance from the fluid inlet plane to the fluid outlet plane varies greatly from the bottom of the fin in contact with the heat source to the top of the triangular tip of the fins. The flow resistance at the top of the unit near the tips of the fins is much less than at the base of the unit, and the most fluid flows where the least heat is to be transferred.

Figure 13:
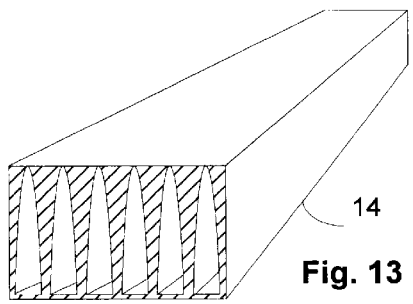
FIG. 13 shows a sketch of a finned heat exchanger set up for moderated flow resistance.
Figure 14:
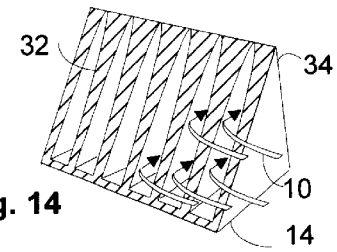
FIG. 14 shows a sketch of a moderated flow heat exchanger unit.
Figure 15:
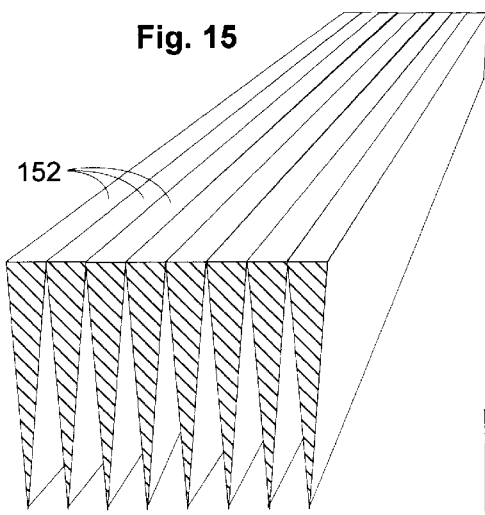
FIG. 15 shows a sketch of a close approximation to the optimal set up of FIG. 13.
Figure 16:
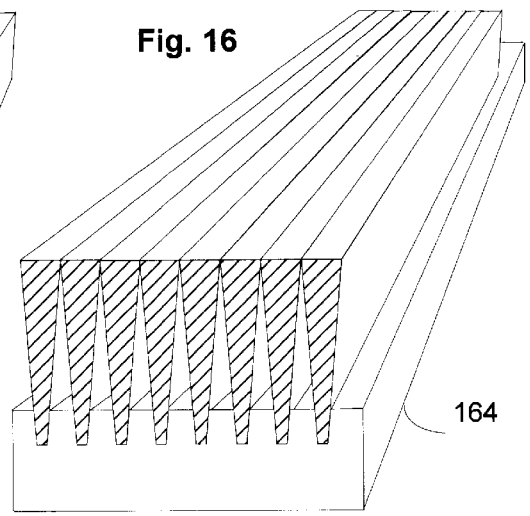
FIG. 16 shows a sketch of the fins of FIG. 15 joined to a base.

In the situation described in the above identified patent, the distance from the inlet planes 32 to the outlet planes 34 decrease linearly with distance from the heated source. To have a properly moderated flow resistance, the gaps between the fins forming the unit should increase quadratically with distance towards the heated source, so that the flow resistance and viscous drag remains approximately independent of height above the heated source. Such a set of fins is sketched in FIG. 13, and the machined triangular unit is sketched in FIG. 14. The optimal situation sketched in FIG. 13, however, is difficult to manufacture. A more manufacturable solution to the problem is shown in FIG. 15, where a series of fins 152, each having a triangular cross section or truncated triangular (not shown) cross section are fitted in slots in a heat conducting base 164 of FIG. 16. The array of fins shown in FIG. 16 can then be machined as disclosed in U.S. Pat. No. 5,504,651 to form a series of inlet channels with decreasing cross sectional area in the direction of fluid flow, and exit channels having an increasing cross sectional area in the direction of fluid flow. Although the straight sided fins shown in FIG. 15 are not optimal, the air flow channels between fins are a close first approximation to the correct channel configuration.

A principle of this invention is that the external surfaces of heat exchange units should act as walls of flow channels to route the heat exchange fluid. Basic to this function is the fact that a substantial component of the flow in channels so made will be parallel to the surfaces of the units, as flow in a pipe is parallel to the surface of the pipe.

Generally there is only one source of pressurized air (positive or negative) that impels the convective flow. Channeling air to and from such a source is known to those skilled in the art for configurations of the convector as shown in FIGS. 1 and 2.

Figure 17:
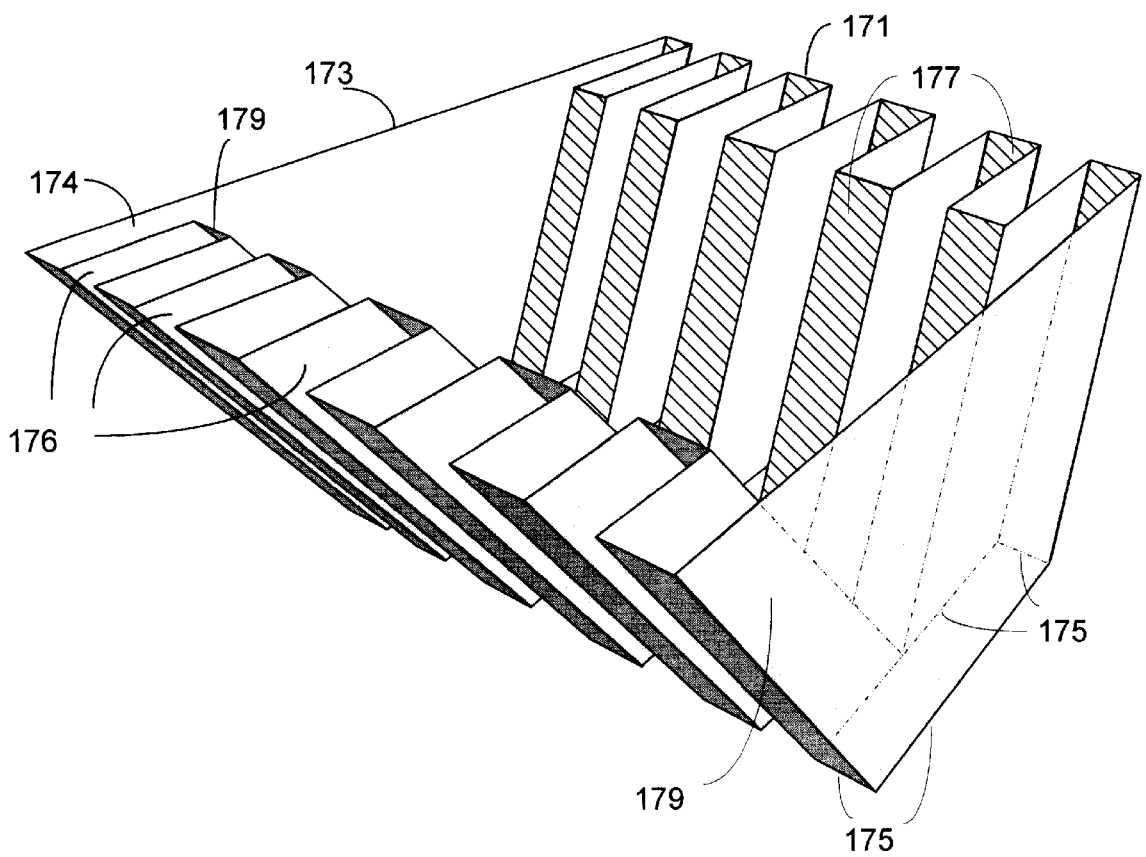
FIG. 17 shows an innovative manifold controlling airflow to the splayed unit configuration of FIG. 12.

The convectors of FIGS. 5, 6, 7, and 12 require a somewhat more complicated manifold to produce a series of adjacent ducts for the interdigitated counterpropagating air streams. FIG. 17 shows an innovative manifold 171 for the splayed unit configuration of FIG. 12. At the top of the device is a large open volume 172 communicating with a series of diverging triangular channels 174 which accumulate the exhaust air from every other slot between two units as shown in FIG. 12. The exhaust air is vented approximately perpendicular to the heated surface 14 shown in FIG. 12. On two opposite sides of the manifold 171, a series of ducts 176 bring air in from a direction perpendicular to the heated surface 14 and deflect the air downward perpendicular to the heated base 14 into alternating ducts between units 30. The edge 173 of the manifold 171 defines an aperture through which the air is exhausted. The manifold 171 may be described mathematically as a continuous sheet in three dimensional space having a first edge 173 and a plurality of additional edges 175. The first edge 173 defines the exit aperture to the manifold 171 in the example chosen. The plurality of additional edges 175 define a plurality of apertures 1751 in the manifold 171 for the entrance of air into the manifold. One of the plurality of additional edges 175 which define the entrance apertures 1751 for the air is shown by dashed lines FIG. 17. The sheet has a first side 177 and a second side 179. The first side 177 contacts and channels the exit air from the interdigitated counterpropagating streams in the embodiment shown in FIG. 17, while a portion of the second side 179 contacts and channels and deflects the air to enter the alternate spaces between the units of FIG. 12. Of course, the airflow may be reversed from that shown in the various diagrams, so that the edge 173 would then define an entrance aperture for the air flow into the manifold 171, and the plurality of edges 175 define the plurality of apertures 1751 which would then act as exit apertures for the air flow.

Figure 18:
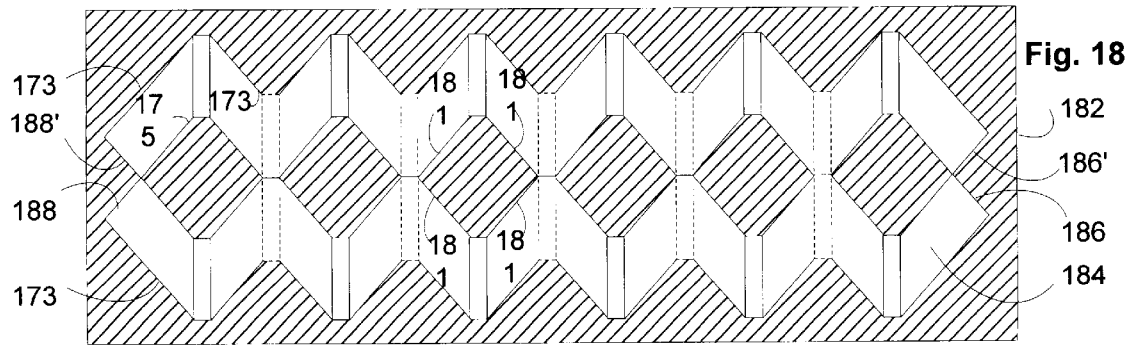
FIG. 18 shows a preferred method of manufacture of the manifold of FIG. 17.

A preferred method of manufacture of the embodiment of the manifold shown in FIG. 17 is shown in FIG. 18. A sheet of foldable material, for example of paper or metal or plastic, is shown as the rectangle 182. The white area 184 is cut or stamped out of the sheet 182, leaving the dark area as waste. The material is folded up (90 degrees) at the solid lines in FIG. 18, and down (270 degrees) at the dashed lines. Such an origami produces the figure of FIG. 17, when the end 186 is appropriately joined to end 186', and the end 188 joined to end 188'. The plurality of stamped out edges 175 left after the central material in FIG. 18 is removed define rectangular apertures 1751 in the manifold 171 when the sheet is folded and joined as described above.

Plan, end elevation, and side elevations for the manifold of FIG. 17 are given in FIG. 19a, 19b, and 19c, respectively. For clarity, the thickness of the material of the sheet 182 is shown with thickness exaggerated. The plurality of apertures 1751 are shown clearly. Note that the sum of the cross sectional areas of the apertures 1751 is less than half the cross sectional area of the aperture defined by edge 163. This expansion of the cross sectional area in the direction of the exit air flow greatly lessens flow resistance in such a device. (If the fluid flow were reversed from the example discussed above, the air flow would be seen to be "focused").

Many nested zig zag strips may alternatively be stamped from a sheet of foldable material, and the flat, laid out manifold of FIG. 18 made by attaching two of them appropriately. In this case, there is very little waste material, as the top half of the material 184 shown in FIG. 18 can be rotated 180 degrees to act as the bottom half.

Alternatively the manifold 171 can be vacuum formed, injection molded, or spin cast. Advantages of this geometry are simplicity of manufacture, low inlet and outlet flow resistance, and space inside the central duct to house the motor for the blower. The angles and distances shown in FIG. 17 are representative only, and may be changed to give relatively greater height or greater length to width ratio of the manifold 171, and greater or less air focusing ability.

FIG. 20a shows a sealing plate 202 configuration for sealing the top of the manifold 171 to a fan for exhausting the air from the units 30. The inside edge 204 of plate 202 closely matches the edge 173 of manifold 171. FIG. 20b shows an optional sealing plate for sealing the bottom of the manifold 171 to the tops of units 30.

It is critical to optimizing the power consumption by the pump for the heat transfer fluid that an efficient pumping mechanism be used. The optimal type of mechanism will vary with the fluid being pumped.

If air is the heat transfer fluid, there are two primary types of competing air movers: fans and blowers. Fans impel axial motion with a propeller like blade; reversing the direction of rotation reverses the direction of flow. Blowers impel radial motion with a flat plate or cylindrical set of blades; reversing the direction of rotation does not affect the direction of flow. Generally fans provide more air flow at lower differential pressure, while blowers provide less air flow at greater differential pressures. Both with operate with this invention. If necessary, a small two stage blower can supply the necessary pressure and flow if the diameter of the blower impeller is constrained.

FIG. 21a and 21b show cross sections of manifold 17 where the body 212 of an exhaust fan 214 is contained within the space 172. FIG. 21a shows the exhaust air flow pattern taken from view A-A' of FIG. 19a, and FIG. 21b shows the entrance air flow pattern taken along view B-B' of FIG. 19a.

Figures 22A, 22B:
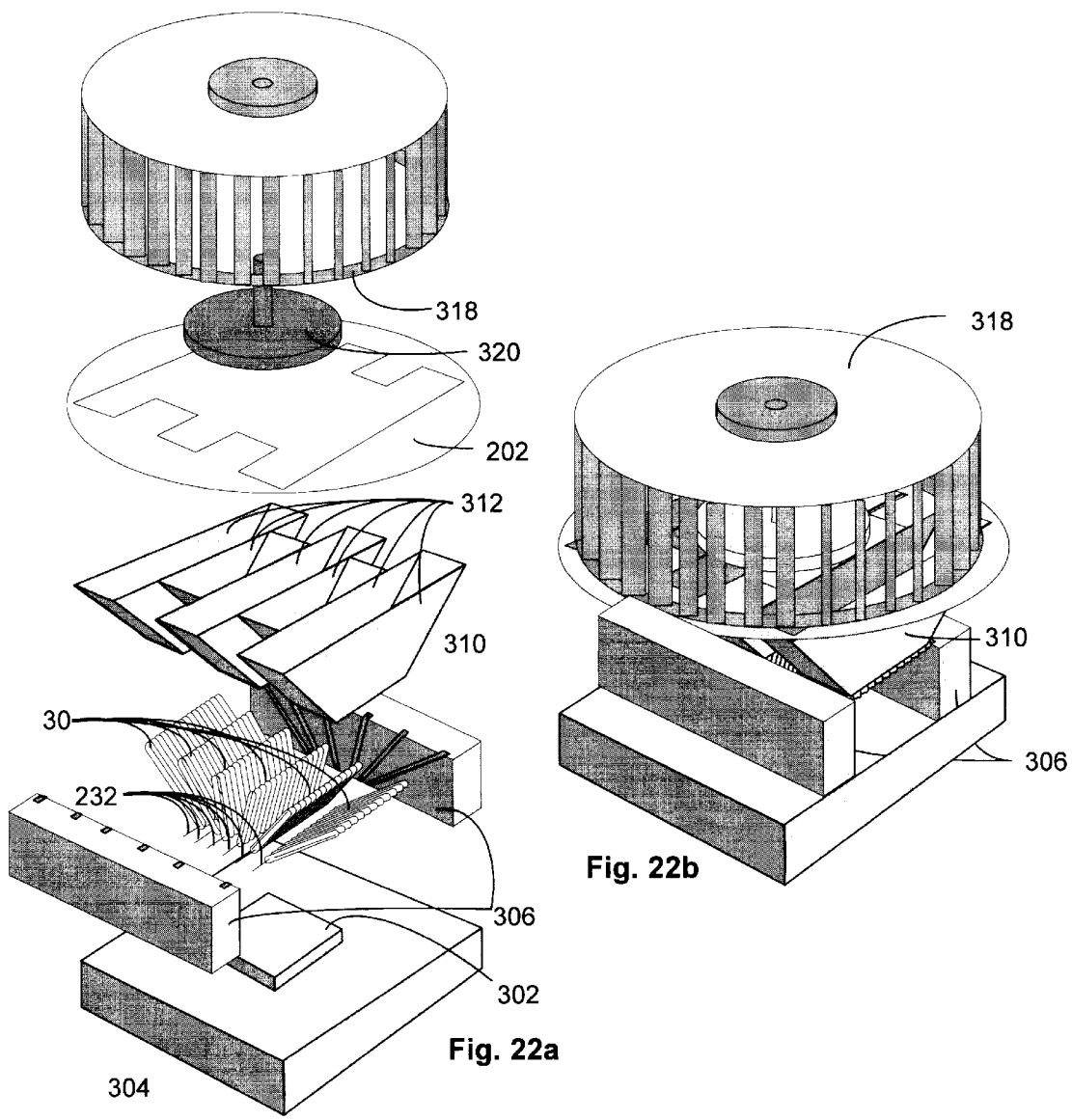
FIG. 22a shows an exploded perspective view of the most preferred manifold of FIG. 17 joined with the most preferred arrangement of FIG. 12 of the most preferred units of the invention of FIG. 10.
FIG. 22b shows the arrangement of FIG. 22a in its assembled and operable configuration.

FIG. 22a shows an exploded cross section of a configuration of the most preferred manifold of FIG. 17 joined with the most preferred splayed convector of FIG. 12 composed of the most preferred units of the invention of FIG. 10. For clarity, the number of units of FIG. 10 has been reduced. In addition, baffle plates 312 have been added to better control the internal air flow in the manifold. FIG. 22b shows the same components as FIG. 22a in their operational configuration. The heated object 302 is contacted by each unit 30, while each unit 30 is held at an angle with respect to its neighbor by frame blocks 306. Frame blocks 306 may contain apertures (not shown) for introducing additional air between the units 102. Spring wires 232 pass through each unit 30 and frame blocks 306 to compliantly press portions of the units 30 against the heated object 302. A manifold 310 mates to all of the units 30 so that vertical plates or baffles 312 of the manifold 310 seal against the upper edge of one of the units 30. A sealing plate 202 attaches to the top of manifold 310, allowing only side and center channels formed by the vertical panels 312 to be in fluid communication with a blower wheel 318. A dc brushless motor 320 attaches to the duct sealing plate 202, and the shaft of the motor 320 rotates the blower wheel 318.

Brushless DC motors are the most efficient fan motors available, and are used in the most preferred embodiments.

Figure 23:
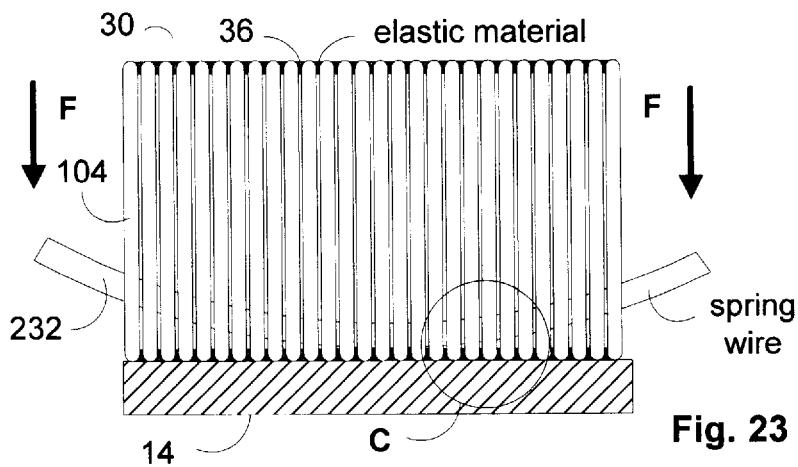
FIG. 23 is a side view of FIG. 10 showing a spring running inside the loops for compliantly pressing the unit against the base.

FIG. 23 is a side view of a unit of FIG. 10 showing a spring 232 running inside the loops 104 for compliantly pressing the unit 30 against the base 14. A force F presses each end of the spring wire 232 down so that the spring wire 232 contacts the bottom of each loop 104 and presses it firmly against the base 14. Such spring means may be used also at the top of each unit, but are less stable than the means shown in FIG. 23.

Figure 24:
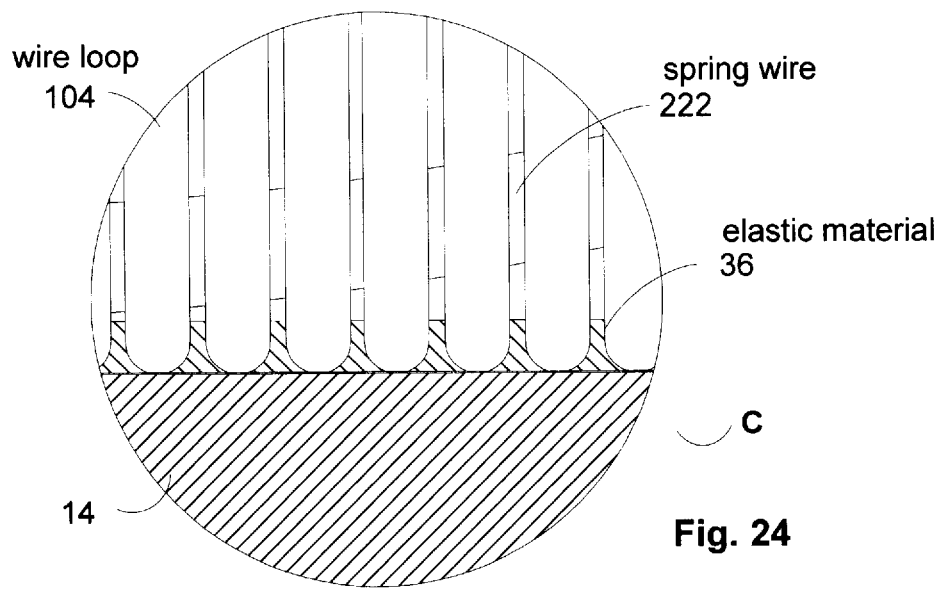
FIG. 24 is an expanded view of region C of FIG. 23.

FIG. 24 is an expanded view of region C of FIG. 23.

Figure 25:
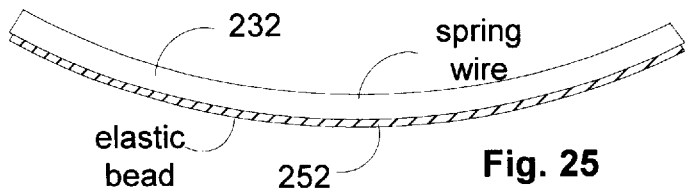
FIG. 25 is a view of the spring of FIG. 23 showing a bead of elastic material for compliantly pressing the loops of FIG. 23 against the base.

FIG. 25 is a view of the spring wire of FIG. 23 showing a bead of elastic material 252 for compliantly pressing the loops 104 of FIG. 23 against the base 14.

FIG. 26a is a view of the cross section of the wires of loops of FIG. 10 showing a rectangular cross section wire and FIG. 26b shows a wire with non rectangular cross section where the sides of the wires against the mandrel are flat, and where the each side of the wire forming the air flow channels between the wires is parallel to another side of the wire so that areas between adjacent wires have uniform gaps.

Experimental results

Performance data for a non-optimal Colburn convector is given below. The prototype of the invention was constructed before the theoretical model was finished, and the prototype design is not optimal for present high end logic chips, IGFET's, or thermoelectric coolers. The measurements of the heat transfer characteristics is within 10% of the model predictions for the prototype of the invention, and for two commercial units where the theoretical model is applicable. A third commercial unit is also compared in the table below.

The heat source is a 136 ohm Firerod heater from Watlow embedded in a three inch aluminum cube. Five faces of the cube are insulated with an inch of structural foam. The heat sink under test and several thermocouples are attached to the remaining face of the aluminum block. Input power is determined by measuring the voltage and current to the heater. Attached to the heater are 6 pairs of units are formed by winding 0.0242 inch diameter tinned copper wire on a 0.69 inch wide and 0.050 inch thick mandrel at a pitch of 28 turns per inch. 0.049 inch diameter straightened music wire is clamped to either edge of the bobbin prior to winding. After winding, glue is applied to the windings where they contact the music wire and allowed to set, so that the spacing remains constant. The winding is lightly crimped around the music wire, which releases tension on the bobbins so that they can be removed. The resulting winding assemblies are cut into twelve 1.8 inch long units, with two units of each width. Grooved frame blocks of Garolite hold the ends of each unit so that there is an 11 degree wedge between each unit, and all of the units contact a common contact plane. Five minute epoxy is applied to the contact plane to form a roughly 0.05 inch thick encapsulation of the wires in the epoxy. This potted section is then ground to mate with the aluminum heater face, and the potted section is attached to the aluminum heater face with standard thermal grease. 13 slots 0.125 inch in width are milled into a sealing plate, which is screwed to the grooved frame so that the webs between the slots contact the tops of each unit. A duct as in FIG. 12 is glued to the sealing plate so that the outer two slots, and otherwise every other slot, of the slotted plate are open to ambient air, while the remaining slots feed the central duct. One of the blowers used to operate the heat sink creates 0.62 inches of water vacuum in the duct while moving 22 cubic feet per minute of air through the units. The blower is a Mini Sirocco fan from Jouning Blower Co., Ltd. Of Taiwan; using 110 VAC at 60 Hertz it is rated at 0.55 inches of water static pressure and 82 cubic feet per minute unloaded. The blower has a 3 inch diameter rotor with 1 inch long fins and rotates at 3,200 rpm. The performance of this prototype invention is summarized in the following table.

TABLE 1

Performance Comparison (smaller is better)

|  | Prototype invention | Thermalloy 2325B heatsink and fan[1] | R-Theta MFP152B heatsink and fan[2] | Aavid Polar Cap 024227 heatsink and fan[3] |
|---|---|---|---|---|
| Thermal resistance | 0.206° C. per watt | 1.00° C. per watt | 0.046° C. per watt | 0.046° C. per watt |
| Aerial thermal resistance | 0.38° C. square inches per watt | 0.68° C. square inches per watt | 1.34° C. square inches per watt | 2.64° C. square inches per watt |
| Volumetric thermal resistance | 0.29° C. cubic inches per watt | 0.27° C. cubic inches per watt | 2.76° C. cubic inches per watt | 13.86° C. cubic inches per watt |
| Air flow | 72 cubic feet per minute | na | 56 cubic feet per minute | 140 cubic feet per minute |

The analysis in Appendix I applies to the prototype invention, as well as the R-Theta and Aavid devices. The table below shows that the unoptimized prototype of the invention has lower thermal resistance and ariel thermal resistance than the commercial logic device cooler (Thermally 2325B) and much lower ariel and volumetric thermal resistivities than the two IGFET coolers (R-Theta and Aavid)

Preliminary analysis shows that the prototype performance may be optimized differently for each application. Specifically the 11 degree angle between the units should be larger for the existing height and gap. The use of rectangular wire as previously described also improves the overall performance.

We claim:

1. A heat transfer unit for transferring heat between an object and a flowing fluid, comprising;

a plurality of elongated loops of heat conducting material in the form of a spiral, each elongated loop having a first end and a second end, the first end of each loop connected in a closely spaced apart relationship to the first end of an adjacent loop, the second end of each loop connected in a closely spaced apart relationship to the second end of an adjacent loop, wherein the ends of each loop are connected in a closely spaced apart relationship to an adjacent loop by an elastic solidified material which adheres to the ends of the loops.

2. The heat transfer apparatus of claim 1, wherein a wire running inside the first end of each loop may act as a spring to press the first end of each loop against the object.

3. A heat transfer unit for transferring heat between an object and a flowing fluid, comprising;

a plurality of elongated loops of heat conducting material in the form of a spiral, each elongated loop having a first end and a second end, the first end of each loop connected in a closely spaced apart relationship to the first end of an adjacent loop, the second end of each loop connected in a closely spaced apart relationship to the second end of an adjacent loop, wherein the ends of each loop are fixedly connected in a closely spaced apart relationship to an adjacent loop by crimping the heat conducting material of each loop around wires running inside each loop.

4. A heat transfer unit for transferring heat between an object and a flowing fluid, comprising;

a plurality of elongated loops of heat conducting material in the form of a spiral, each elongated loop having a first end and a second end, the first end of each loop connected in a closely spaced apart relationship to the first end of an adjacent loop the second end of each loop connected in a closely spaced apart relationship to the second end of an adjacent loop, wherein a wire running inside the first end of each loop may act as a spring to press the first end of each loop against the object.

5. The heat transfer apparatus of claim 1, wherein the plurality of elongated loops is made from a metal wire.

6. The heat transfer apparatus of claim 5, wherein the metal wire has a cross section, the cross section having a first side for contacting the object, a second side and a third side for forming gas flow channels between adjacent loops, where the second and the third sides are parallel.

7. A heat transfer unit for transferring heat between an object and a flowing fluid, comprising;

a plurality of elongated loops of heat conducting material in the form of a spiral, each elongated loop having a first end and a second end, the first end of each loop compliantly connected in a closely spaced apart relationship to the first end of an adjacent loop, the second end of each loop compliantly connected in a closely spaced apart relationship to the second end of an adjacent loop, whereby significant relative motion is allowed between each adjacent end of each loop.

8. The heat transfer apparatus of claim 7, wherein a wire running inside the first end of each loop may act as a spring to press the first end of each loop against the object.

9. The heat transfer apparatus of claim 7, wherein the plurality of elongated loops is made from a metal wire.

10. The heat transfer apparatus of claim 8, wherein the metal wire has a cross section, the cross section having a first side for contacting the object, a second side and a third side for forming gas flow channels between adjacent loops, where the second and the third sides are parallel.

* * * * *